United States Patent [19]

Tarbouriech

[11] 4,283,690
[45] Aug. 11, 1981

[54] LOW POWER CMOS OSCILLATOR

[75] Inventor: Jean-Claude Tarbouriech, Ville-la-Grand, France

[73] Assignee: Motorola, Inc., Schaumburg, Ill.

[21] Appl. No.: 108,913

[22] Filed: Dec. 31, 1979

[51] Int. Cl.³ .......................................... H03K 3/354
[52] U.S. Cl. ............................... 331/111; 331/108 D
[58] Field of Search .................... 331/57, 111, 108 C, 331/108 D, 113 R, 143

[56] References Cited

U.S. PATENT DOCUMENTS

| 3,921,101 | 11/1975 | McCoy et al. | 331/108 D |
| 3,995,232 | 11/1976 | Laugesen | 331/111 |
| 4,115,748 | 9/1978 | Kubo et al. | 331/111 |

Primary Examiner—Siegfried H. Grimm
Attorney, Agent, or Firm—Joe E. Barbee

[57] ABSTRACT

A low power, single pin CMOS oscillator has been provided which exhibits good frequency stability with voltage supply variations. The oscillator uses a capacitor which is connected to the inputs of two inverters. One inverter is used to drive a P-channel transistor and the other inverter is used to drive an N-channel transistor. Both P-channel and N-channel transistors are connected in series and provide an output from a junction formed between the two transistors. A latch is connected to the junction formed between the two transistors and the output of the latch is coupled to the capacitor to charge and discharge it.

9 Claims, 3 Drawing Figures

LOW POWER CMOS OSCILLATOR

This invention relates, in general, to oscillators, and more particularly, to a low power consumption, complementary metal oxide semiconductor (CMOS) oscillator.

CMOS circuits have commonly been used in applications requiring low power consumption. However, in CMOS circuits having oscillators, often times the oscillator ends up consuming a relatively large amount of power due to leakage paths occurring in the transition region of the P-channel and N-channel transistors. Many CMOS oscillators either have one or two interface pins. In the single pin configuration, typically, a capacitor is connected from the pin to ground. One particular CMOS oscillator of the past had a single interface pin with a capacitor connected from the interface pin to ground. A series of an odd number of inverters were arranged in a loop wherein the input to the first inverter was connected to the interface pin and the output of the last inverter was connected to the interface pin. A plurality of series connected inverter pairs were then placed in parallel with a connection between the first inverter and a second inverter forming the loop to provide a latch. In such an oscillator the first inverter stays in the transition-region and both of its transistors have to be large enough to overcome the drive from the inverters forming the latch, and as a result, the leakage current is large.

Accordingly a problem with many CMOS oscillator circuits of the past has been that they consume a greater amount of power than is desired for many CMOS integrated circuits used in battery operated equipment. Also in some cases the oscillator frequency has not been as stable as required with power supply variations. In addition, it is desirable to have as small a capacitor as possible to obtain a desired frequency with the proposed oscillator. When a capacitor is small enough it can be integrated as part of an integrated circuit chip, and the smaller the capacitor the less chip area required for the capacitor.

Accordingly, it is an object of the present invention to provide a CMOS oscillator circuit having lower power consumption.

Another object of the present invention is to provide a CMOS oscillator circuit which is relatively frequency stable with voltage supply variations.

Yet another object of the present invention is to provide a CMOS oscillator which requires a relatively small size capacitor.

A further object of the present invention is to provide a single pin low power consumption CMOS oscillator which exhibits substantial frequency stability with power supply variations.

SUMMARY OF THE INVENTION

In carrying out the above and other objects of the present invention, there is provided, in one form thereof, a CMOS oscillator requiring a single interface pin. The CMOS oscillator is powered from a first and a second power supply node. A P-channel transistor is coupled in series with an N-channel transistor between the first and second power supply nodes. A capacitor having a first and a second terminal is coupled from the single interface pin to ground, and the interface pin is coupled to the inputs of a first and a second inverter each having an output. The output of the first and second inverters are each coupled to the control electrodes of the P and N channel transistors, respectively. A third inverter has its input coupled to a node formed between the P-channel and N-channel transistors. The third inverter has an output which is also coupled to the node formed between the P-channel and N-channel transistors. A fourth inverter has its input coupled to the output of the third inverter and provides an output which is coupled through a fifth inverter to the single interface pin.

The subject matter which is regarded as the invention is set forth in the appended claims. The invention itself, however, together with further objects and advantages thereof, may be better understood by referring to the following detailed description taken in conjunction with the accompanying drawings.

DETAILED DESCRIPTION OF THE DRAWINGS

Figure 1:
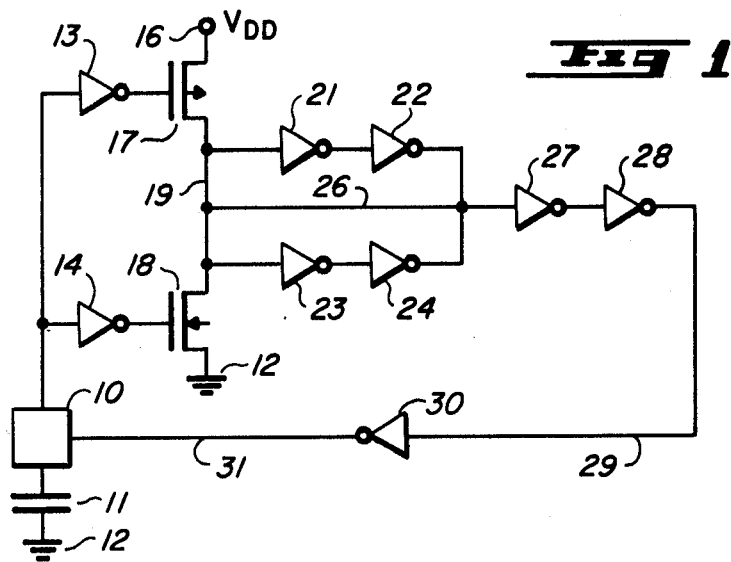
FIG. 1 illustrates one embodiment of the present invention.

A CMOS oscillator which can be made as an integrated circuit chip is illustrated in FIG. 1. The oscillator, of FIG. 1, has a single interface pin 10. A capacitor 11, which is illustrated as being external to the integrated circuit chip, is connected from interface pin 10 to a circuit reference potential 12 illustrated as ground. It should be noted that if capacitor 11 is integrated as a part of the integrated circuit then interface pin 10 could simply be an internal mode of the integrated circuit. Inverters 13 and 14 have inputs connected to interface pin 10. Inverter 13 provides an output to the gate electrode of a P-channel transistor 17, and inverter 14 provides an output to the gate electrode of an N-channel transistor 18. Transistors 17 and 18 are connected in series between $V_{DD}$ voltage terminal 16 and ground terminal 12. Inverters 13 and 14 can, as may the other inverters used herein, by any conventional inverters; however, in a preferred embodiment the inverters are CMOS inverters comprised generally of a P-channel and an N-channel transistor connected in series having their gate electrodes connected together forming an input and providing an output from a node formed between the P-channel and N-channel transistors. Inverter 13 is made with a large P-channel transistor and with a long N-channel while inverter 14 is made with a long P-channel transistor and with a large N-channel transistor. This means that the transistors of inverters 13 and 14 are proportioned such that the switching input voltage of inverter 13 is approximately equal to the supply voltage $V_{DD}$ minus a P-channel threshold voltage, whereas, the switching input voltage of inverter 14 is approximately equal to an N-channel transistor threshold voltage. Exemplary sizes of transistors that can be used are given hereinafter.

An output node 19 is formed between transistors 17 and 18, and is connected to the inputs of inverters 21, 23, and 27. The connection to the input of inverter 17 is via line 26. The output of inverter 21 is connected to the input of inverter 22 while the output of inverter 23 is connected to the input of inverter 24. The output of inverters 22 and 24 are connected together to the input of an inverter 27. The outputs of inverters 22 and 24 are also coupled to node 19 by line 26. The output of inverter 27 is connected to the input of an inverter 28, and the output of inverter 28 is connected to the input of an inverter 30 by line 29. Inverter 30 has an output which is connected to interface pin 10 by line 31 thereby closing the loop on pin 10. In the past, CMOS oscillators have been built having one inverter connected directly from pin 10 to node 19. Such an oscillator did not have transistors 17 and 18, and in some cases had another pair of series connected inverters in parallel with inverters 21 and 22. Such an oscillator only required two inverters coupled from the output of the series connected parallel arranged inverters back to pin 10. This type of prior oscillator has a higher power consumption, exhibits greater frequency variations with power supply variations, and requires larger capacitors than does the oscillator of the present invention.

If it is assumed that the potential across capacitor 11, of the oscillator of FIG. 1, is increasing it means that the output of an inverter 30 is high. As the potential across capacitor 11 increases, the output of inverter 14 will switch before the output of inverter 13 since inverter 14 requires a lower switching input voltage. The increasing voltage at pin 10 will cause the output of inverter 14 to switch low and transistor 18 will be cut off. As the voltage pin 10 continues to increase, eventually inverter 13 will switch causing its output to go low thereby enabling transistor 17. When transistor 17 is enabled node 19 will rise towards $V_{DD}$ thereby causing the outputs of inverters 21 and 23 to go low which causes the output of inverters 22 and 24 to go high thereby reinforcing the high on line 26. The high on node 19 and line 26 will cause inverter 27 to switch thereby providing a low on the input of inverter 28 which causes inverter 28 to provide a high on line 29. The high on line 29 will cause inverter 30 to provide a low on line 31 thereby causing capacitor 11 to discharge back through inverter 30. As capacitor 11 is discharging, the output of inverter 13 will switch to a high level as the voltage on pin 10 decreases to its switching input voltage thereby disabling transistor 17. As capacitor 11 continues to discharge, the output of inverter 14 will be switched to a high level, thereby enabling transistor 18. By transistor 18 being enabled node 19 will be held at a low level which places a low level at the input of inverter 27 by way of line 26, by way of series inverters 21, 22, and by way of series inverters 23, 24. The low on the input of inverter 27 places a low on line 29 which causes the output of inverter 30 to go high thereby starting the charging of capacitor 11 again and the cycle continues to repeat itself. If complementary outputs are needed they can be tapped off the outputs of inverters 27 and 28.

It should be noted that P-channel transistor 17 is made large enough to overdrive the combination of the outputs of inverters 22 and 24, and thereby set the latch formed by series connected inverters 21, 22, line 26, and series connected inverters 23, 24. The transistors of inverters 21, 23, and 27 are proportioned such that the switching input voltage of inverter 27 lies between the switching input voltages of inverters 21 and 23. Inverter 30 supplies the charging current for capacitor 11 and therefore the size of the charging transistor in inverter 30 will effect the charging time, and in a similar manner, the discharging time of capacitor 11 is proportional to the physical size of the discharging transistor in inverter 30. In a typical CMOS inverter the charging transistor will be the P-channel transistor and the discharging transistor will be the N-channel transistor.

By way of example only, and assuming that all of the inverters of FIG. 1 are conventional CMOS inverters having a P-channel and an N-channel transistor, the following transistor sizes in microns can be used in conjunction with a capacitor of 10 nanofarads to provide a frequency of approximately 125 Hertz with a $V_{DD}$ voltage of 5 volts.

| Reference Number | P TRANSISTOR width | P TRANSISTOR length | N TRANSISTOR width | N TRANSISTOR length |
|---|---|---|---|---|
| 13 | 80 | 9 | 6 | 80 |
| 14 | 6 | 80 | 80 | 6 |
| 17 | 15 | 9 | — | — |
| 18 | — | — | 15 | 9 |
| 21 | 20 | 9 | 10 | 9 |
| 22 | 6 | 50 | 6 | 50 |
| 23 | 10 | 9 | 20 | 9 |
| 24 | 6 | 50 | 6 | 50 |
| 27 | 15 | 9 | 15 | 9 |
| 28 | 15 | 9 | 15 | 9 |
| 30 | 10 | 75 | 10 | 125 |

Figure 2:
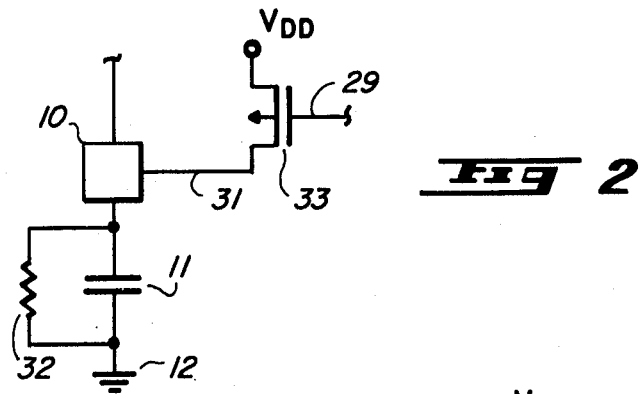
FIG. 2 illustrates a modification which can be made to the circuitry of FIG. 1.

Because the current supplied by inverter 30 changes with temperature, the stability of the frequency with temperature can be improved by replacing inverter 30 with a large P-channel transistor and by adding an external resistor in parallel with capacitor 11 as illustrated in FIG. 2. FIG. 2 shows a portion of the circuitry of FIG. 1 along with the changes to improve the temperature stability of the oscillator. A large P-channel transistor 33 has its gate electrode connected to line 29 which carries the output of inverter 28. Transistor 33 has one current carrying electrode connected to $V_{DD}$ and the other current carrying electrode connected to line 31 which goes to interface pin 10. A resistor 32 is connected in parallel with capacitor 11, and when the output of inverter 28 is low, thereby placing a low on line 29, transistor 33 will be enabled thereby charging up capacitor 11 very rapidly. Conversely when the output of inverter 28 provides a high level on line 29 transistor 33 will be disabled and capacitor 11 will discharge slowly through resistor 32. The "on" or conducting resistance of P-channel transistor 33 should be much lower than the resistance of resistor 32, so that the charging time of capacitor 11 will be much shorter than the discharging time and the variation of the charging time with temperature will have a negligible influence on the overall period. However, it should be noted that an oscillator having the modification shown in FIG. 2 will have much poorer frequency stability with power supply variations than will the oscillator illustrated in FIG. 1.

In the oscillator illustrated in FIGS. 1 and 2, only inverters 13 and 14 remain in the transition region during normal operation, however, the leakage current is limited to a minimum by using a long transistor in each of the inverters. The transition region is the input voltage range for which both P-channel and N-channel transistors conduct current. A CMOS inverter is in the transition resion if its input voltage is above the threshold voltage of the N-channel transistor and below the supply voltage minus the P-channel threshold voltage. In the transition region, a leakage path is established from the $V_{DD}$ supply to ground through the series connected P-channel and N-channel transistors.

Figure 3:
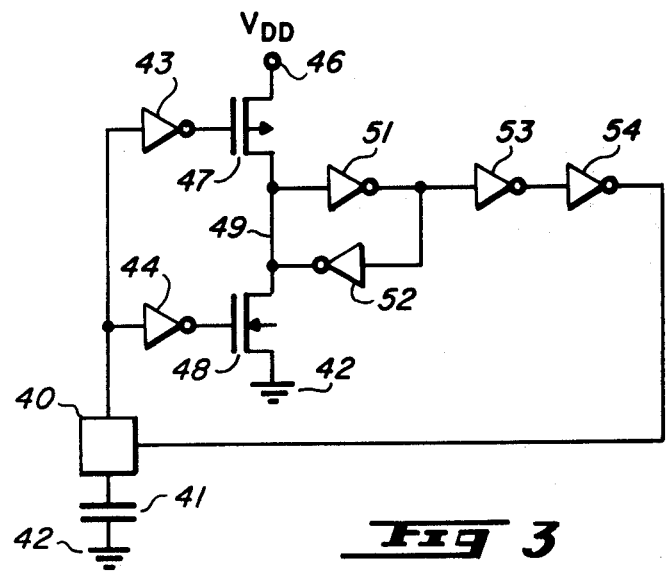
FIG. 3 illustrates yet another embodiment of the present invention.

FIG. 3 illustrates a simplified CMOS oscillator having the features of the present invention. The oscillator operates in a similar manner as does the oscillator of FIG. 1. A capacitor 41 is coupled between ground reference node 42 and interface pin 40. Pin 40 is also connected to the inputs of inverters 43 and 44. The output of inverter 43 is connected to a control electrode of a P-channel transistor 47 while the output of the inverter 44 is connected to the control electrode of an N-channel transistor 48. P-channel transistor 47 and N-channel transistor 48 are connected in series between voltage terminal nodes 46 and 42. Voltage terminal 46 receives power supply voltage $V_{DD}$. A node 49 is formed between transistors 47 and 48 and is connected to an input of an inverter 51. The output of inverter 51 is connected to the input of an inverter 52. The output of inverter 52 is connected to node 49 thereby forming a latch with inverters 51 and 52. The output of inverter 51 is also connected to the input of an inverter 53 whose output is connected to the input of an inverter 54. The output of inverter 54 is connected to interface pin 40.

As the output of inverter 54 charges capacitor 41, inverter 44 will provide a low output to the gate electrode of N-channel transistor 48. This will cause transistor 48 to cease conducting and when the switching input voltage of inverter 43 is reached, the output of inverter 43 will go low thereby enabling transistor 47 which causes node 49 to start increasing voltage wise. The increasing voltage at node 49 will overcome the output of inverter 52 and cause inverter 51 to provide a low output. The low output on inverter 51 will cause inverter 52 to provide a high output which maintains node 49 at a high potential. Inverter 53 inverts the output of inverter 51 and inverter 54 inverts the output of inverter 53 which causes capacitor 41 to start discharging back through inverter 54. As capacitor 41 discharges, inverter 43 will switch its output to a high level which disables transistor 47, and as capacitor 41 continues to discharge inverter 44 will then switch enabling transistor 48. When transistor 48 is enabled, node 49 will be pulled towards ground. The cycle then repeats itself.

The CMOS oscillator of the present invention is particularly useful as an LCD display driver, and the simplified oscillator of FIG. 3 readily lends itself to driving a two digit LCD display.

By not it should be appreciated that there has been provided a CMOS oscillator which has low power consumption, exhibits good frequency stability with voltage power supply variations, requires a low value oscillating capacitor, and only requires a single interface pin. When the supply voltage increases, the current from the inverter, which is used to charge and discharge the capacitor, increases, however, the voltage range over which the capacitor is charged and discharged also increases. In other words, the capacitor is charged faster over a wider voltage range, and therefore the frequency changes very little.

I claim:

1. A CMOS oscillator having a first and a second power supply node, comprising: a first and a second series connected transistor being coupled between the first and second power supply node, the first and the second transistor each having a control electrode; a first and a second inverter each having an input and an output, the inputs being coupled together and the output of the first inverter being coupled to the control electrode of first transistor, the output of the second inverter being coupled to the control electrode of the second transistor; a third inverter coupled to a node formed between the first and second transistors, the third inverter having an output coupled back to the node formed between the first and second transistors; a fourth inverter having an input coupled to the output of the third inverter, the fourth inverter providing an output; a fifth inverter having an input coupled to the output of the fourth inverter and providing an output coupled to the inputs of the first and second inverters; and a capacitor coupled from the inputs of the first and second inverters to the second power supply node.

2. The CMOS oscillator of claim 1 wherein the first transistor is a P-channel field effect transistor and the second transistor is an N-channel field effect transistor.

3. The CMOS oscillator of claim 2 wherein the output of the third inverter is coupled back to the node formed between the first and second transistors by a sixth inverter.

4. The CMOS oscillator of claim 2 further including a seventh inverter having an input coupled to the output of the third inverter and having an output coupled to the input of the fourth inverter and to the node formed between the first and second transistors; and an eighth inverter coupled between the output of the fifth inverter and the inputs of the first and second inverters.

5. The CMOS oscillator of claim 4 further including ninth and tenth inverters connected in series between the node formed between the first and second transistors and the input of the fourth inverter.

6. The CMOS oscillator of claim 1 wherein the thresholds of the first and second inverters are asymmetrical so that one of the inverters will provide a predetermined output at a lower input voltage than the other inverter.

7. The CMOS oscillator of claim 4 wherein the eighth inverter is a transistor having a first, a second, and a control electrode, the first electrode being coupled to the first power supply node, the second electrode is coupled to the inputs of the first and second inverters and the control electrode is coupled to the output of the fifth inverter; and further including means in parallel with the capacitor to discharge the capacitor.

8. A CMOS oscillator having a first and a second power supply node, comprising: a P-channel transistor having a first and a second electrode and a control electrode, the first electrode being coupled to the first power supply node; an N-channel transistor having a first and a second electrode and a control electrode, the first electrode of the N-channel transistor being coupled to the second electrode of the P-channel transistor, the second electrode of the N-channel transistor being coupled to the second node of the power supply; a first inverter having an output coupled to the control electrode of the P-channel transistor and having an input; a second inverter having an output coupled to the control electrode of the N-channel transistor and having an input; a capacitor having a first and a second terminal, the first terminal being coupled to the inputs of the first and second inverters and the second terminal being connected to the second power supply node; and latch means coupled to the first electrode of the N-channel transistor and providing an output coupled to the first terminal of the capacitor.

9. The CMOS oscillator of claim 8 wherein the CMOS oscillator is a monolithic integrated circuit having a single interface pin, the single interface pin having the first terminal of the capacitor attached thereto so that the capacitor can be an external component.

* * * * *